June 26, 1962 H. DA COSTA 3,040,489

SEMICONDUCTOR DICING

Filed March 13, 1959 2 Sheets-Sheet 1

INVENTOR.
Harry da Costa,
BY Mueller & Aichele
Att'ys.

SEMICONDUCTOR DICING

INVENTOR.
Harry da Costa
BY Mueller & Aichele
Atty's.

United States Patent Office 3,040,489
Patented June 26, 1962

3,040,489
SEMICONDUCTOR DICING

Harry da Costa, Scottsdale, Ariz., assignor to Motorola, Inc., Chicago, Ill., a corporation of Illinois Filed Mar. 13, 1959, Ser. No. 799,372
10 Claims. (Cl. 53—21)

This invention relates to the semiconductor art and more particularly to the formation of semiconductor elements or dice for use in the manufacture of semiconductor devices such as transistors, and to the equipment used in such formation.

In the manufacture of many of the present day semiconductor devices very small elements or units of crystalline semiconductor material, such as germanium or silicon, are used in conjunction with suitable electrodes or contacts. In some instances the very small dimensions of such a semiconductor unit assist in securing desirable high frequency characteristics for the complete semiconductor device, and these individual units may be less than one-hundredth of an inch thick and only a few hundredths of an inch in width or length. Obviously production and handling of such units is difficult. Furthermore, this material which must be of a proper chemical composition and physical construction is costly, and it usually requires considerable processing before the very tiny units are in final condition for use in a semiconductor device. The relatively high cost of processing the semiconductor material up to a condition for use makes it desirable to reduce waste in the forming of the units, and this cost makes it desirable at all times to handle the material with care so as to avoid damage to its delicate structure in the handling alone.

While various types of apparatus and methods have been devised in the past to divide a piece of semiconductor material into many smaller pieces, this prior art has not proven satisfactory for desirably high productivity of dice of the above described type. By way of explanation of the terms used herein and of the processing of material in general, we wish to point out that in this art the original semiconductor crystal is cut or otherwise acted upon to provide a number of wafers. These are lapped and polished and otherwise processed to attain the correct thickness and smoothness. The wafer is then cut or broken to provide a number of slabs. Then the slabs are processed and separated into a plurality of dies, which in the plural are called "dice." It is the processing of the slab to provide dice with which this invention is concerned. A copending application of Friedrick W. Schwarz, Serial No. 633,151, filed on January 8, 1957, and assigned to the present assignee, now Patent No. 2,970,730, describes and claims a method of processing semiconductor material to provide dice. Briefly, that method involves scribing a crystal wafer along lines which define the dice areas, and flexing the wafer with a rotating member while retaining the wafer on a flexible sheet so as to break the wafer at each scribe line. The present invention uses the essential principles of that method and represents an improvement in the processing and apparatus for accomplishing such dicing.

Semiconductor material such as germanium or silicon is hard and brittle, and this characteristic together with the required very small physical size of a finished die presents considerable difficulty in successfully forming semiconductor dice in production quantities. Difficulty has also been experienced in finding a simple and expeditious method of handling the material during processing and up to the final assembly in a semiconductor device so as to prevent chemical contamination of the dice, and avoid physical damage to each die and to the contacts when they are applied thereto before assembly of the die in the final device.

This situation is particularly critical in the case of a semiconductor slab or wafer upon which multiple electrodes are applied before breaking the slab into the much smaller dice which are very minute in size. Not only might the die itself be injured, but the microscopic electrodes or stripes as they are called in one type of unit, must be protected against injury. The metallic stripe electrodes are applied to the slab in what is intended to be the center of the final individual dies. Any abrasion of the surface of the slab or the wafer, or injury to the electrodes has been found to destroy the useful properties of the ultimate semiconductor device. The steps in the complete processing of the crystal and the equipment employed in that processing between the time the electrodes are applied to a slab and up to the assembly of a die in a transistor or other semiconductor device are, therefore, extremely important. They are important from the standpoint of care and speed so that the production yield is high and so that the costs are maintained at a minimum. The prior art has left much to be desired in these respects.

An object of this invention is to increase the yield of usable miniature dice or semiconductor material in processing them from a larger slab of material down to such plurality of dies.

Another object is to provide a method and means for forming uniform and reproducible semiconductor dice so that the ultimate devices into which the dice are assembled are dependably uniform in operating characteristics.

Another object is to reduce the possibility of contamination or physical damage of semiconductor material during a dicing operation of that material.

A still further object of this invention is to simplify and expedite the handling of minute dice of semiconductor material after they have had delicate portions such as electrodes applied in a previous process step so as to avoid damage to the electrodes.

A feature of the invention is the provision of improved pressure rolling apparatus for breaking a scribed slab of semiconductor material into minute dice, including a dual-position work support having a yieldable portion thereon for supporting such material, and roller means for applying breaking pressure in each of two directions.

A further feature is the provision of a semiflexible encasing package for a scribed slab of semiconductor material which is to be diced by means of roller breaking, and which package retains and protects the material against chemical contamination and physical injury during the rolling operation, and maintains the many minute dice in their original orderly position for easy and rapid handling after breaking.

Another feature of the invention is the provision of a method for handling a scribed semiconductor in a slab-dicing operation and in the subsequent placement of the diced elements in a speedy and orderly fashion, which method includes the packaging of a slab of the material in a flexible sheet of transparent paper, and roller-flexing of the package so formed under controlled pressure on a yieldable surface while retaining the material encased with the dice visible but protected from outside contamination. Furthermore, the dice are maintained in a systematic order within the package for the breaking steps, and in the proper aligned positions for ready removal for further assembly operations such as the placement of a die in a semiconductor header assembly.

Referring now to the drawings:

FIG. 1 is a greatly enlarged and exploded perspective view of a transistor utilizing a die constructed in accordance with the present invention; and to help in visualizing the minute sizes of objects with which the invention is primarily concerned;

FIG. 1*a* is a perspective view of the completed transistor of FIG. 1 in actual size;

Briefly, in a particular form thereof, the invention concerns a method and apparatus for forming a plurality of semiconductor dice from a larger slab of the material. Such a slab, preferably rectangular in shape, is cleaned and rendered of the proper composition and structure to be diced into a number of usable units or dice. The slab is scribed along a series of parallel lines, and then further scribed along a second series of parallel lines which are at right angles to the first series of lines in order to define a plurality of rectangular or square dice of the desired size. Merely as an example, each finished die which has been constructed in accordance with this invention for one type of transistor is 25 mils square and 3 mils thick. The scribed slab is fitted in an aperture of a semi-flexible metal sheet and sealed both on the top and bottom of the aperture, preferably with cellophane, to provide visibility for the semiconductor material within the aperture, and provide protection in the package thus formed for such material. This package is placed on a resilient pad which in turn is mounted on a supporting table over which a pressure roller moves. The resilience of this pad together with the diameter and weight of the roller together with a predetermined pressure applied through the roller, are all related to the size and hardness characteristics of the units to be diced. The package of the scribed semiconductor slab material is then rolled, first with the roller axis parallel to one set of scribed lines, and then rolled again with the roller axis parallel to the other set of scribed lines to break the slab into individual dies. The top of the package is opened, but the dice remain systematically oriented in aperture or window of the package for convenient handling in the final assembly of a transistor or the like. The package prevents chemical or other contamination during the dicing, and during the time each die is being removed for subsequent assembly.

Figure 7:
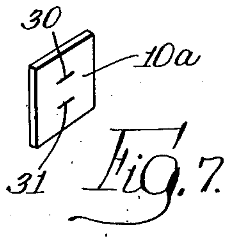
FIG. 7 is a greatly enlarged view of a die such as is broken from a slab in the present dicing operation.
Figures 1, 1A, 2, 3:
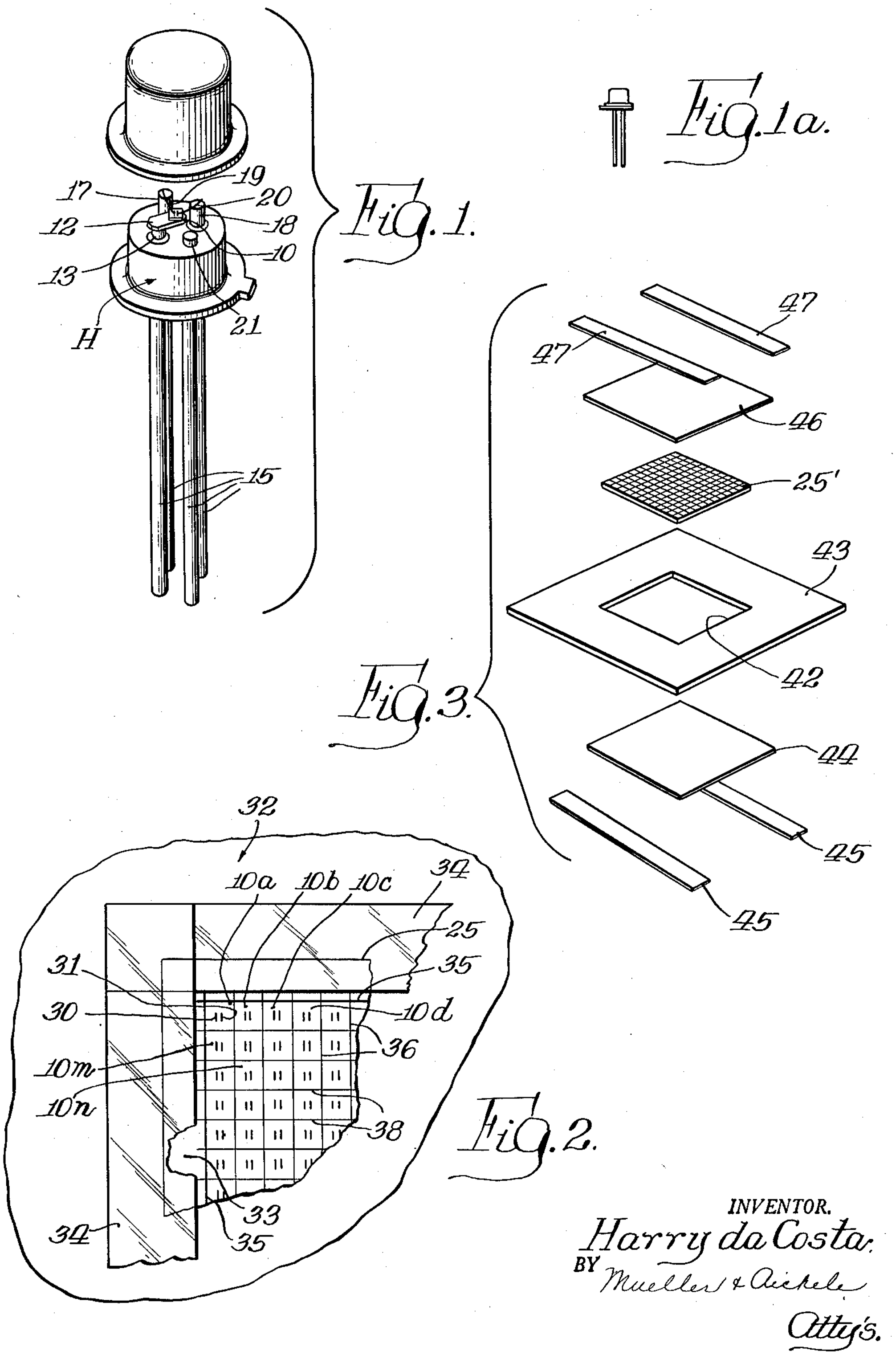
FIG. 2 is a greatly enlarged view of a broken portion of a slab in its initial condition after the electrodes are applied and when mounted on a work holder for the scribing operation and scribed.
FIG. 3 is an exploded view of the parts of the package for the semiconductor slab after the scribing operation and after the inactive portion of the slap is removed, with such slab in a condition ready for breaking.

In order to better understand the present invention, a typical transistor device containing a semiconductor die processed by this invention is illustrated in FIGS. 1 and 1*a*. The former shows a perspective view of a transistor with its cover removed. The semiconductor die 10 (shown in FIG. 7 and there numbered **10*a* corresponding to the identification in FIG. 2) formed in accordance with the present invention is supported on a molybdenum slab or member 12 which is affixed to post 13 insulatingly mounted on a header H, providing an electrical connection to one of the lead wires 15 of the transistor. Additional posts 17 and 18 similarly mounted are connected by respective wires 19 and 20 to suitable contacts on the surface of the semiconductor die 10. The posts 17 and 18 are also connected to respective ones of the mounting or lead wires 15 in order to make electrical connection to electrodes of the semiconductor wafer. Post 21** is connected to the metal housing of the header H.

In this particular transistor illustrated, the casing is approximately 0.173 inch in height and 0.200 inch in diameter at its widest part. The semiconductor die 10 is 25 mils square and 3 mils thick at its thickest portion. These dimensions emphasize the almost microscopic size of the elements to be provided in practicing the present invention, and FIG. 1*a* illustrates the minute size of the completed transistor.

As an example of the manufacture of a transistor such as that shown in FIG. 1, and utilizing such a die, a crystal of semiconductor material is grown, and cut into the desired wafers. The wafers are lapped, etched to a thickness of 3 mils, cleaned and washed, or otherwise processed. Then a wafer is applied to an adhesive coated material, is diamond scribed, and is then broken into a plurality of slabs, which in one instance are ⅜ inch square. Thereafter the broken pieces or slabs, are removed from the adhesive, cleaned, and put into a diffusion furnace, where the desired diffusant is applied particularly to one side, but it normally also diffuses with both sides. The diffused layer on one side is removed.

Then pairs of metallic contact stripes or electrodes such as stripes 30 and 31 of the wafer designated **10*a* in FIG. 2 are applied to the slab 25**. This is done by evaporation for the slab described in the example illustrated herein.

FIG. 2 shows such a square slab 25, which is germanium in the example being described. This is to be broken or diced into a plurality of semiconductor dice **10*a*, 10*b*, 10*c*, etc. In this particular example, the stripes are one mil by two mils in plan dimension and in the order of 1,000 angstroms thick. Pairs of such stripes are spaced approximately 0.5 mil apart, and a pair is applied to each of the slab areas to be formed into dice 10*a*, 10*b*, 10*c*, etc. These are then used in the ultimate transistor by connecting the wires 19 and 20** thereto (FIG. 1).

As has been previously mentioned, it is the breaking and handling of a semiconductor slab after the stripes are applied, and the apparatus for accomplishing the same which is claimed herein.

The slab 25 is now ready for the dicing operation of the present invention, and it is placed upon a steel work holder 32 with the stripe or electrode side up. The work holder is illustrated simply in a fragment in FIG. 2, and is shown complete in FIG. 4. It is machined to the necessary fineness or smoothness so that the slab will lie perfectly flat on the holder. The slab is fastened to the holder or table 32 with pieces of adhesive tape 34 placed around an inactive periphery 33 and extending onto the holder. Excess adhesive tape which might extend over the edge of the work holder 32 is removed, and the work holder is then moved by hand to the proper position in a diamond scriber (not shown).

The operator carefully determines the inside limits of the inactive area 33, and scribes a heavy line 35 around all four sides of the active area of the slab so that such area can be easily broken off with forceps or the like after the scribing operation and before inserting the slab in the breaking package. The heavy lines are inscribed with the holder in two positions turned 90° from one another, in the same manner as is done for the dice-scribe lines as will be described.

A series of lines 36 are then lightly scribed by the diamond scribe into the surface of the slab to a depth of approximately .0001 inch in order to define one dimension of a formed die. The holder is turned 90°, and after carefully positioning the slab relative to the scriber, it is diamond-scribed again along lines 38 which are perpendicular to the lines 36. These lines 36 and 38 define unbroken die sections of rectangular or square shape in the center of each of which is located a pair of stripes as 30 and 31. In the particular slab 25 being described, eleven scribed lines are applied in each direction in order to define 144 die areas, and these are bounded by the heavy scribed lines 35. The die areas are squares which are 25 mils in each dimension.

Figure 4:
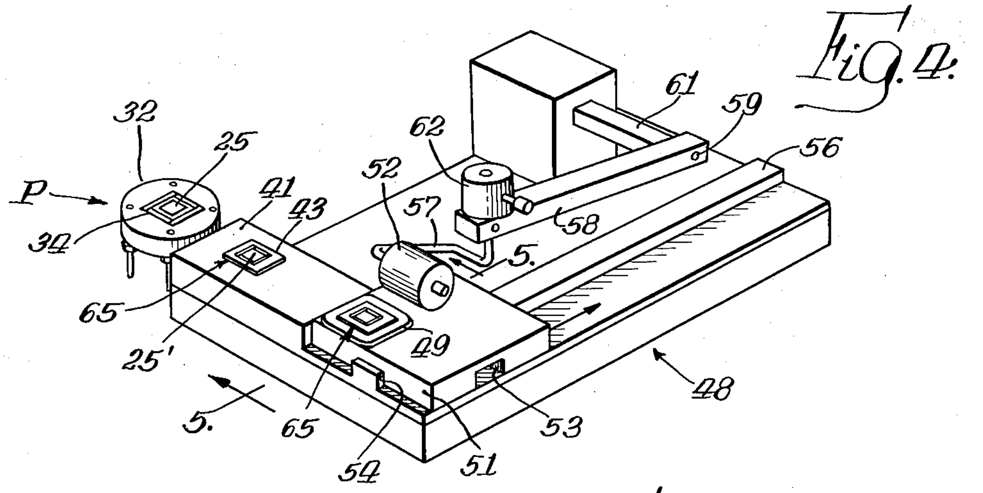
FIG. 4 is a perspective view of the pressure rolling apparatus of this invention.

After this scribing operation is completed, the work holder is removed from the scriber and may be placed upon posts in the position of FIG. 4. The tape 34 is removed, and the inactive area broken off at the heavy scribed line 35 all the way around. The restricted slab which is now designated by the reference character 25', can be slid or lifted into the window of a stainless steel sheet on the work table 41. The scribed slab is approximately 0.300 inch square, and it is this form of slab which is ready for final dicing.

Inasmuch as the holding tape 34 was secured only to the inactive area 33 and to the workholder 32, there is no adhesive or contaminant which has to be cleaned off on the internal active or striped area. This is particularly important because the attaching of the adhesive tape and such cleaning could damage the stripes 30, and 31 as well as the surface of each die.

As shown in FIG. 3 the scribed slab 25' is positioned in the window or aperture 42 in the sheet 43 which is of substantially the same thickness as the slab. Sheet 43 may be formed of stainless steel which has some flexibility, and the rectangular opening 42 corresponds quite closely to the outside dimensions of the slab 25'. The illustrated embodiment of member 43 is .735" square, and approximately .003" thick. The window 42 is .308" square. At the time the slab is inserted in the opening 42, a piece of thin flexible plastic material 44 such as cellophone, or some other suitable flexible material has been secured to the stainless steel sheet 43 by means of a suitable adhesive tape 45. This provides a pocket for the slab. After the scribed slab 25' is inserted, the top of the opening 42 is covered by another piece of thin flexible plastic 46. The cellophone or plastic pieces 44 and 46 should be chemically clean at the area corresponding to the aperture 42 in order to prevent contamination of the slab 25'.

The cellophone piece 46 may be conveniently secured to the top of the metal sheet 43 by means of adhesive tape 47 which will not touch the slab 25'. This can also be accomplished by providing adhesive on the edges of the pieces 44 and 46 outside of any contact with the slab. The tape is shown merely for illustration, and it is understood that the amount of adhesive tape used or the adhesive on the outside edges is sufficient so the assembly will form a flexible package or packet 65 with the slab completely encased and being visible through the cellophane. As shown in FIG. 4 the packet or package 65 may be put together on a work holder 41 which is mounted on the base of the rolling machine 48.

The packet 65 is then moved to the right as shown in FIG. 4, and placed on a resilient supporting pad 49 positioned near one corner of a square sliding table 51. Orientation of the packet 65 must be accurate with respect to the axis of the roller 52 and, accordingly, it is preferable to secure the packet 65 in an aligned position on the pad 49 by means of adhesive plastic tape.

The package is placed on the pad 49 with the top or striped side downward on the pad, and in that manner the scribed grooves on the slab 25' are likewise pointed downward against the pad 49. Thereafter as the roller 52 bears down on the package 65 direct contact is made with the plastic covering 44 which protects the slab on that side, and the stripes 30 and 31 and the top side of the slab bear against the other covering 46. We have previously pointed out that the top sheets or coverings 44 and 46 are neutral chemically, and are provided so as to be entirely free of dirt or other contaminant. Consequently, the delicate and fragile semiconductor slab is maintained in position within the frame 43, and is protected on both faces during the breaking operation.

More specifically, the breaking apparatus 48, in addition to the sliding work table 51, and the roller 52, comprises related parts with both of such elements. The table 51 has a pair of grooves 53 and 54 precisely cut at right angles to one another on the underside of the table and centrally of each of the respective sides as shown in FIG. 4. A track 56 extending longitudinally of the machine corresponds in outer dimension to the inside of each groove 53, and 54, and guides the table 51 as it is pushed rearwardly from the position illustrated in FIG. 4 to a position wherein the package 65 has passed beneath the roller 52.

The roller assembly includes an arm 57 serving as the axis for the roller, and such arm in turn is mounted rigidly in an arm 58 which is pivoted at 59 to an axis member 61 mounted on the machine. The roller 52 is of hard steel or bronze, and for one embodiment of this invention is 1¼ inches in diameter and of a width sufficient to overlap the outer edges of the slab 25'.

Semiconductor materials such as germanium and silicon are very strong mechanically but extremely brittle. This latter characteristic in particular contributes to the commercial value of the apparatus of the present invention because of the damage which might occur from directly touching a semiconductor slab, or die, during processing. Furthermore both the slab and then each die are relatively minute, and the latter is almost microscopic in size so that any improper breaking of any portion of the die might reduce its size or injure the structure so as to make it unusable.

Figure 5:
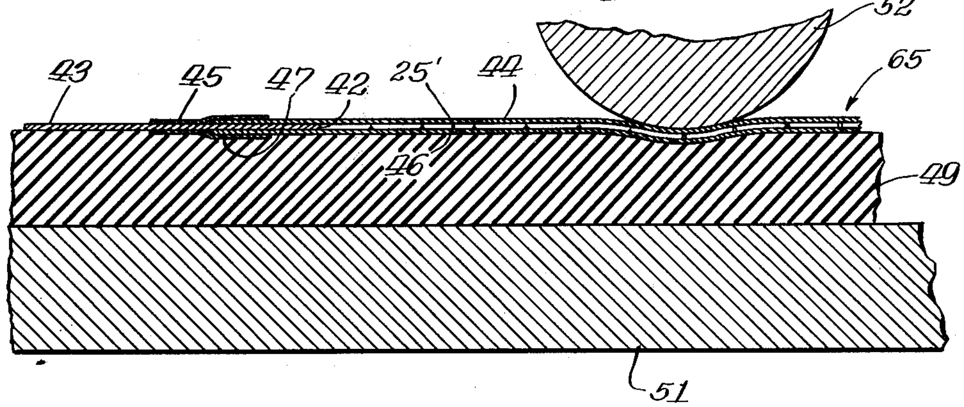
FIG. 5 is a sectional view which would be illustrative if taken through line 5—5 of FIG. 4, when the roller is in engagement with the slab package to break the slap or wafer into dice. This illustrates the breaking operation generally, but in view of the minute size of the crystal pieces, the drawing is greatly enlarged and it is not to scale.

With the scribed lines 36 and 38 defining each die in the slab 25' extending very slightly (in the order of .0001 inch) into the surface in the slab but facing downward against the resilient pad 49 when in breaking position, a proper pressure exerted by the roller 52, and a proper hardness to the pad 49 causes just enough deflection between adjacent rows of dice that cracking at such lines as indicated in FIG. 5 is accomplished. Broken dice are illustrated toward the right hand end of FIG. 5. Although the rubber pad 49 is referred to as flexible it is actually relatively hard. Then with the diameter and hence circumference of the roller gauged relative to the size of each die and the distance between adjacent scribed lines, the breaking force is applied at the stress concentration notches represented in the scribed lines, and fracture of the slab is correspondingly controlled and limited. The deflection of the pad 49 for the fracturing operation can be observed only under a microscope.

Because of the hardness and yet brittleness of the semiconductor slab, mechanical pressure in the order of tens of thousands of pounds per square inch are applied by the roller 52 to the slab package in the operation just described. The roller itself in one embodiment of the present invention weighs one-half pound. The arm and roller support structure applies additional weight to the slab 25'. Different weights 62 can be placed on the pivoted arm 58 until the correct weight is found to provide the desired pressure. In the embodiment of this invention to which reference is being made, the rubber pad or platen 49 is of a 70–80 "Shore" hardness, and the roller successfully breaks a germanium slab which is .003 inch in thickness, and which has scribed lines which are .030 inch from one another. The plastic sheet material 44 and 46 such as cellophane or the like is from .0015 to .002 inch in thickness.

Expressing in words the different relationships determining the weight to effect dicing, it can be said that the weight effective at the roller is correlated with the roller radius, and is of such an order as to produce the necessary distortion to the rubber pad 49 as to overstress the germanium wafer or slab 25', and cause fractures at the scribed lines, or stress concentration lines 36, 38. The size of the dice to be fractured, both in area and thickness influence the weight effective at the roller 52.

After the package 65 on the table 51 and the roller 52 have moved relative to one another and the slab 25' has been fractured along one set of scribed lines 36—38, then the table 51 is removed from the machine and turned 90° so that the groove 53, for instance, can be interconnected with the track 56. The table 51 is again moved rearwardly as shown in FIG. 4, and the roller passes over the package in a direction at right angles to the first passage so that the slab is fractured along the other set of lines 36—38.

Figure 6:
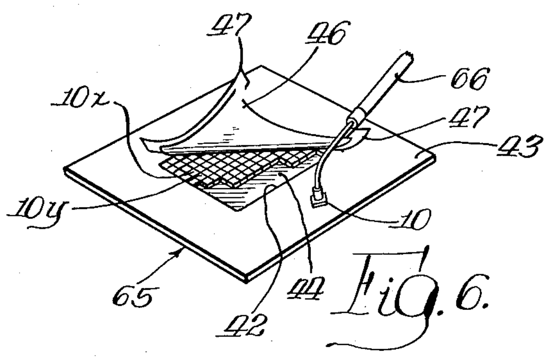
FIG. 6 is a perspective view of the semiconductor slab package after the dicing operation has been performed, and with the dice ready to be removed from the package of FIG. 3.

Thereafter, the package or packet 65 is removed from the pad 49, and the top cellophane sheet 46 in turn is removed as illustrated in FIG. 6. The dice which originally comprised the slab 25' are fractured at the scribe lines but are positioned within the opening 42 in the metal sheet 43, and the stripe electrodes 30 and 31 are aligned relative to one another and ready for removal to be mounted by an appropriate fixture on the molybdenum slab 12 in the transistor assembly as shown in FIG. 1. One convenient means for removing a die 10 from the opened package 65 is illustrated in FIG. 6, and comprises a vacuum pick-up device 66. The orientation of the dice in the aperture 42 as maintained after breaking is important because each stripe 30, 31 is of different material, and one serves as the emitter electrode and the other as the base electrode. They are originally evaporated onto the slab 25 with one type on the left in each die area and the other type on the right. Because of the packaging of the present invention, they can be picked therefrom knowing that the right stripe will be in the desired position on the molybdenum tab 12.

To briefly recapitulate:

Semiconductor material is prepared for processing by the apparatus and the method of the present invention by providing a semiconductor crystal wafer or slab in whatever condition is required according to the specifications for the ultimate dice to be assembled into particular semiconductor devices. The wafer or slab is scribed by conventional scribing means which will divide the wafer or slab by scribed lines in one surface into a plurality of dies. Then that wafer or slab is acted upon according to the present invention as follows:

(1) It is encased in a package or packet (as 65) which by means of clean plastic pieces protects each surface of the crystal unit (25'—FIG. 3) against contamination or physical damage, and which by means of a yieldable metal frame 43 defines an opening 42 for the unit which orients the unit relative to the breaking means, and with the plastic pieces maintains the dice (10*a*, 10*b*, 10*c*, 10*x*, 10*y*, etc.) in the same relative position after breaking as they had before breaking.

(2) The closed package 65 is placed upon a yieldable surface or pad 49 which is mounted upon a table or support 51, and fastened or otherwise retained in a position on that surface so that one set of the scribed lines (as 36, for instance) extend in the direction of relative longitudinal movement of the table 51 (or the breaking means as roller 52). The other set of scribed lines 38 are at right angles to such line of movement.

(3) In the present apparatus embodiment the table 51 is slid rearwardly as viewed in FIG. 4, guided by the recess 54 and track 56 structure until the package and the crystal unit 25' therein has passed entirely under the roller 52 which as an assembly represents a weight and applies a pressure such as to fracture the crystal unit along the scribed lines 38 as illustrated in FIG. 5, wherein the fractured portions are shown at the right hand side of the illustration.

(4) Then the table 51 is moved to the left in FIG. 4 and off the track 56. It is reassembled with the recess 53 on the track 56. In this position, and moving the table to the right in FIG. 4, the crystal unit 25' is fractured along the scribed lines 36, and the plurality of dies are then each in the condition of the die 10*a* of FIG. 7.

(5) The plastic sheet 46 which is adjacent the face of the crystal unit, or more properly, adjacent the faces of the separated dice (duplicates of the die 10*a* of FIG. 7) with the electrodes 30—31 thereon, is pulled away from the frame 43, exposing for removal all of such dice. Each die is so minute even as illustrated in FIGS. 3, and 6, that an illustration of the electrodes as 30 and 31 was found to confuse more than help the showing. Accordingly, an illustrative line indicating an electrode is shown only in FIGS. 2, and 7 for the unassembled units, but it is understood that such electrodes have been applied to the crystal unit in the condition shown in FIG. 3, and that the two electrodes are on each die in the condition shown in FIG. 6. They appear in FIG. 1 because of the desirability of illustrating a typical complete transistor leader assembly.

(6) With the sheet 46 removed, as contrasted to the position shown for illustrative purposes in FIG. 6, the dice are arranged so that the emitter electrode and the base electrode are each in the same position for each die. The assembler can use a suction pickup 66 to remove each die directly from the package and place it in position on the tab 12 as shown in FIG. 1.

It is understood from the preceding description, therefore, that the present invention provides apparatus and a process for dicing or breaking and thereafter handling a semiconductor slab or piece of material from which a plurality of die are obtained. The dice are protected throughout against dirt or other contamination so that no cleaning operation is necessary during the entire course of processing after lines are scribed on a semiconductor slab. The apparatus breaks or dices a slab efficiently and cleanly, and without damage to the die, so that a high yield of uniform, usable dice are available in oriented readily movable condition.

Furthermore, the apparatus can be adjusted or fitted readily to break slabs of different size and characteristics, and the dice themselves broken from each slab can be of different predetermined dimensions.

Time is saved and damage is avoided by virtue of the fact that after a slab has electrodes thereon and is scribed, it can be encased and thereafter does not have to be cleaned in any way right up through the step of assembling a die into a semiconductor device.

I claim:

1. Apparatus for breaking a flat brittle member of semiconductor material and the like into dice defined by intersecting sets of parallel scribe lines therein, said apparatus including in combination, a semi-flexible transparent package comprising a sheet member having an opening to fit the brittle member and transparent encasing means for sealing the brittle member in the opening of said sheet member, a roller having a roller axle, a pivotally mounted carriage supporting said roller axle horizontally and perpendicularly to limit pivotal movement of said carriage, a worktable having a yieldable pad carried thereon for supporting said package with the member to be broken, guide means for supporting said worktable in two positions with respect to said roller for relative movement between said roller and said worktable with said roller movable across said package perpendicular to a set of the scribe lines in each position of the worktable to provide roller flexing of the brittle member, and removable weight means supported on said carriage for regulating the pressure of said roller on said package to apply breaking pressure along the scribe lines of the brittle member.

2. A method of dicing semiconductor wafers which includes, providing a flexible member which has an opening therein to accommodate a semiconductor wafer having a series of parallel scribe lines in one surface, retaining the wafer in the member by flexible cover means disposed on each side of the opening to encase the wafer and form a packet, supporting the packet on a resilient surface, pressure rolling the packet on the resilient surface with the roller axis substantially parallel to the scribe lines to concentrate a breaking stress at such scribe lines and break such wafer into a plurality of units defined by such scribe lines.

3. Apparatus which accomplishes wholly by deflecting the breaking of a flat brittle member into a plurality of units with milli-inch dimensions accurately defined by scribe lines in such member, said apparatus including in combination a flat yieldable surface adapted to support the brittle member thereon, mechanical means of a predetermined weight having a rounded symmetrical smooth surface mounted to move about an axial line and adapted to apply a downward pressure on the brittle member while moving about the axial line, said surface of said mechanical means having a radius of curvature substantially greater than any dimension of the individual units defined by said scribed lines, means supporting said yieldable surface, means supporting said mechanical means, and with one of said supporting means being movable relative to the other so that pressure is applied through said surface of said mechanical means to a brittle member on said yieldable surface over an area on each side of a scribe line sufficient to deflect the brittle member and the yieldable surface an amount to provide a breaking pressure in the brittle member at a scribe line, and means for accomplishing such application of pressure successively over the brittle member at all scribe lines thereon.

4. Apparatus for breaking a flat brittle member into a plurality of units defined by scribe lines in such member, said apparatus including in combination means for encasing the brittle member which means has a flexible but non-breakable frame with an opening therein for receiving and positioning said brittle member therein before, during, and after the breaking operation, and which encasing means has flexible but non-breakable closure means for said frame to permit insertion of the brittle member in the opening and thereafter permit removal of the broken units from said encasing means, said apparatus also including yieldable surface means for supporting the encasing means in a predetermined position on said surface, and breaking means adapted to engage the encasing means on one side thereof and to apply pressure progressively over the full extent thereof to depress the encasing means and the yieldable surface thereunder and flex the brittle member at successive areas longitudinally of scribe lines so as to fracture said brittle member at said scribe lines.

5. In apparatus for breaking a brittle thin semiconductor crystal wafer into a plurality of units defined by scribe lines in such wafer by means of relatively great pressure applied through a roller in the apparatus to the wafer which is resting on a yieldable surface in the apparatus which deflects from such pressure when the wafer is deflected, a package for encasing such brittle semiconductor crystal wafer so as to protect each of the two sensitive faces thereof against physical injury and against contamination while retaining the plurality of units in alignment after breaking, said package including a semi-flexible flat metal sheet of substantially the same thickness as the crystal wafer and having an aperture therein generally corresponding in size to the wafer to be placed therein which sheet has the characteristic of withstanding relatively great pressure impressed thereon without breaking and of thereafter returning to its original flatness for a subsequent use, a piece of plastic sheet adhesively maintained on said metal sheet on one side thereof to close the aperture on that side and a second piece of plastic sheet adhesively maintained to the metal sheet on the other side thereof to close the aperture on that side, and with said two plastic sheet pieces and the rim of said aperture forming a casing for said wafer while it is being broken and after the breaking.

6. In apparatus having yieldable surface means, pressure means, and supporting structure for each such that one of said means may be moved in a longitudinal direction relative to the other for a predetermined distance in order to apply downward pressure through the pressure means against a package which encases a brittle, thin, and hard semiconductor crystal wafer therein to break the wafer into a plurality of units defined by scribe lines cut in one surface of the wafer and extending in two different directions at right angles to one another, the novel means for encasing such a crystal wafer including in combination a flat member of resilient metal which will permit substantial pressures to be applied thereto to deflect the same but which will return to a flat configuration when the pressure is removed, said flat member having an opening centrally thereof to accommodate the crystal wafer and a frame portion entirely around said opening, a yieldable plastic member adhesively secured to the frame portion on one side of the metal member but clean and free of any material on the side thereof toward the opening and for the area which would engage the crystal wafer at the opening, and a second yieldable plastic member secured to the other side of the metal member and clean and free of all contaminating material in an area corresponding at least to the opening in the metal frame member, with said encasing means adapted to have a crystal wafer within the opening of the metal member and protected on each side thereof by the yieldable plastic members and capable of having pressure means applied thereto over the extent thereof in two directions at right angles to one another to break the crystal wafer along the scribe lines.

7. Apparatus for breaking a semiconductor crystal wafer into a plurality of minute die units defined by a plurality of scribed lines extending in two directions at right angles to one another in one surface of said crystal wafer, said apparatus including in combination pressure means having a smooth and hard curved surface whose radius of curvature is many times greater than any dimension of the units defined by said scribed lines, support means having an originally flat yieldable surface adapted to be deflected selectively at the place of application of pressure thereon and then restore itself to a flat condition, with the hardness of said support means at said surface portion being comparatively great so as to limit the deflection thereof to an extremely small distance compared to the over-all dimensions of said wafer, means mounting said pressure means so as to apply pressure through said curved surface thereof to a wafer when mounted on said yieldable surface of said support means, with such pressure application acting to deflect the crystal wafer and the yieldable surface to an amount that the wafer breaks along a scribed line, and means for providing relative movement between said support means and said pressure means for causing said curved surface to roll over said wafer such that the breaking pressure is applied progressively over the wafer at successive scribed lines at right angles to the direction of movement to thereby break said wafer at said scribed lines.

8. Apparatus for accomplishing the breaking of a thin, flat member which is hard and brittle into a plurality of four-sided units defined by a plurality of scribed lines in one surface of said member and extending in two directions at right angles to one another, said apparatus including in combination pressure means having a smooth and hard curved surface whose radius of curvature is substantially greater than any over-all dimension of the individual units defined by said scribed lines, support means having an originally flat surface portion which is yieldable upon application of pressure thereto by said pressure means and yet is sufficiently hard as to limit the deflection thereof to a small distance compared to the largest over-all dimension of the individual units, means mounting said pressure means to permit the application of pressure through said curved surface thereof to said flat member when placed on said support means for establishing stress in such member which is sufficient to break the same along a scribed line thereof, and means for providing relative movement between said support means and said pressure means for causing said curved surface to roll over said flat member when placed on said support means to apply breaking pressure at successive scribed lines at right angles to the direction of movement for breaking such member at said successive scribed lines.

9. A method of breaking a semiconductor wafer into a plurality of four-sided units defined by a first set of parallel scribed lines and a second set of parallel scribed lines perpendicular to the first set, all scribed to a shallow depth in one surface of the wafer, which method includes framing and encasing said wafer in a packet with a flexible framing portion fitting about the periphery of said wafer and with flexible cover portions respectively on the major sides of said wafer, and pressure rolling the packet on a resilient surface first in the direction of one set of scribed lines in said wafer and then in the direction of the other set of scribed lines therein to break said wafer along said scribed lines, thereby forming a plurality of four-sided units which are retained in an oriented condition by said packet.

10. A method of breaking a semiconductor wafer into a plurality of four-sided units defined by a first set of parallel scribed lines and a second set of parallel scribed lines perpendicular to the first set, all scribed to a shallow depth in one surface of the wafer, which method includes framing the wafer about the periphery thereof with a flexible frame which retains the wafer in the plane thereof, applying flexible material at both major sides of said wafer and said frame to retain the wafer in said frame and form a packet, and pressure rolling the packet on a resilient surface first in the direction of one set of scribed lines in said wafer and then in the direction of the other set of scribed lines therein to break said wafer along said scribed lines, thereby forming a plurality of four-sided units which are retained in an oriented condition by said packet.

References Cited in the file of this patent

UNITED STATES PATENTS

| | | |
|---|---|---|
| 954,773 | Armstrong | Apr. 12, 1910 |
| 2,167,734 | Zonino | Aug. 1, 1939 |
| 2,286,960 | Hall | June 16, 1942 |
| 2,352,319 | Harris | June 27, 1944 |
| 2,447,258 | Lobley | Aug. 17, 1948 |
| 2,555,916 | Clark | June 5, 1951 |
| 2,774,194 | Thatcher | Dec. 18, 1956 |
| 2,970,730 | Schwarz | Feb. 7, 1961 |